United States Patent
Uemura

(10) Patent No.: US 6,765,822 B2
(45) Date of Patent: Jul. 20, 2004

(54) MEMORY DEVICE

(75) Inventor: Tetsuya Uemura, Tokyo (JP)

(73) Assignee: NEC Corporation, Tokyo (JP)

( * ) Notice: Subject to any disclaimer, the term of this patent is extended or adjusted under 35 U.S.C. 154(b) by 99 days.

(21) Appl. No.: 10/195,370

(22) Filed: Jul. 16, 2002

(65) Prior Publication Data

US 2003/0026126 A1 Feb. 6, 2003

(30) Foreign Application Priority Data

Aug. 6, 2001 (JP) ........................................ 2001-237285

(51) Int. Cl.$^7$ ............................................. G11C 11/00
(52) U.S. Cl. ...................................... 365/159; 365/148
(58) Field of Search ................................. 365/159, 148

(56) References Cited

U.S. PATENT DOCUMENTS 5,953,249 A * 9/1999 van der Wagt ............. 365/175
6,015,738 A * 1/2000 Levy et al. ................. 438/275

FOREIGN PATENT DOCUMENTS

| JP | 6-61454 | 3/1994 |
| JP | 6-112438 | 4/1994 |
| JP | 6-132491 | 5/1994 |
| JP | 7-78945 | 3/1995 |
| JP | 10-69766 | 3/1998 |
| JP | 2000-312136 | 11/2000 |

* cited by examiner

Primary Examiner—David Nelms
Assistant Examiner—Tu-Tu Ho
(74) Attorney, Agent, or Firm—Young & Thompson

(57) ABSTRACT

A memory cell is formed by an FET, a gate of which is connected to the word line and a drain of which is connected to the bit line; a capacitor, one end of which is connected to a source of the FET and the other end of which is connected to a first power supply; a first negative differential resistance element provided between the word line and the source of the FET; and a second negative differential resistance element provided between the source of the FET and a second power supply.

4 Claims, 6 Drawing Sheets

MEMORY DEVICE

BACKGROUND OF THE INVENTION

1. Field of the Invention

The present invention relates to a memory device, and more particularly to a memory device having a negative differential resistance device such as a tunnel diode.

2. Related Art

In a semiconductor random-access memory (hereinafter referred to as a RAM), and particularly in the case of a 1T/1C (one-transistor/one-capacitor) dynamic RAM (DRAM) made up of a plurality of cells, each of which is composed of one transistor and one capacitor element, the simplicity of the configuration of the memory is resulting in the integration levels that are currently reaching the gigabit level. In the 1T/1C DRAM, however, because the electrical charge accumulated in the capacitor element is lost at a fixed rate as a leakage current, it is necessary to perform a refreshing operation periodically, at a rate of approximately several to several tens of times per second for the capacitor element.

In a static RAM (SRAM), although refreshing is not required and the speed attained is generally higher than that of a DRAM, the fact that the SRAM requires a flip-flop circuit makes it more complex than a DRAM, it being common to configure such a memory using 6 transistors or 4 transistors and 2 polysilicon negative differential resistances, thereby resulting in a lower level of integration than the case of DRAMs.

There is therefore a desire for a memory configuration not only having the same degree of integration as DRAMs, but also not requiring a refreshing operation like SRAMs.

Such a memory configuration is disclosed, for example, in Japanese unexamined Patent Publication (KOKAI) No.10-69766, in the form of an SRAM using a resonant tunnel diode (RTD).

FIG. 8 of the accompanying drawings is a circuit diagram showing the configuration of this conventional memory cell, and FIG. 9 is a drawing illustrating the operation of the circuit of FIG. 8 in the waiting condition.

As shown in FIG. 8, the memory cell has an N-channel FET 103, the gate and the drain of which are connected to a word line 101 and a bit line 102, respectively, a cell capacitance 104 connected between the N-channel FET 103 and a cell plate CP, and the first and the second negative differential resistance devices 105 and 106, connected in series between power supply potentials VDD and VSS. The cell node SN of the negative differential resistance devices 105 and 106 is connected to the source of the N-channel FET 103.

When the memory cell is in the waiting state, that is, when the word line potential is low and the N-channel FET 43 is in the off state, the memory cell holds the content of the memory by the electrical charge stored in the cell capacitance 104. In a conventional DRAM, because of a leakage current, the amount of charge stored in the memory cell changes and information cannot be held statically. On the other hand, the series circuit formed by the negative differential resistance devices 105 and 106 has two stable operating points, shown as 111 and 112 in FIG. 9. The cell node SN voltage, therefore, is established as either one of two voltages that correspond to the two stable operating points 111 and 112, thereby enabling static holding of information.

In the conventional memory cell described above, however, in order to drive the negative differential resistance device, it is necessary to have interconnects for supplying the power supply voltage VDD and VSS for each memory cell, thereby not only increasing the surface area of the cells, but also reducing the degree of freedom possible in cell layout.

Accordingly, it is an object of the present invention to solve the problems of the prior art noted above, by providing a memory device with a small cell surface area and a high degree of freedom in cell layout.

SUMMARY OF THE INVENTION

In order to achieve the above-noted object, the present invention adopts the following basic technical constitution.

The first aspect of the present invention is a memory device having a memory element provided at an intersection of a word line and a bit line, the memory element comprising; an FET, a gate of which is connected to the word line and a drain of which is connected to the bit line; a capacitor, one end of which is connected to a source of the FET and the other end of which is connected to a first power supply; a first negative differential resistance element provided between the word line and the source of the FET; and a second negative differential resistance element provided between the source of the FET and a second power supply.

In the second aspect of the present invention, the FET is an N-channel FET and a potential of the second power supply is a prescribed potential greater than 0V.

In the third aspect of the present invention, the FET is a P-channel FET and a potential of the second power supply is 0V.

In the fourth aspect of the present invention, the negative differential resistance element is either an Esaki diode or a resonant tunnel diode.

The fifth aspect of the present invention is a memory device having a memory element provided at an intersection of a word line and a bit line, the memory element comprising; an FET, a gate of which is connected to the word line and a drain of which is connected to the bit line; a capacitor, one end of which is connected to a source of the FET and the other end of which is connected to a power supply; a first negative differential resistance element provided between the word line and the source of the FET; and a second negative differential resistance element provided between the source of the FET and the power supply.

The sixth aspect of the present invention is a memory device having a memory element provided at an intersection of a word line and a bit line, the memory element comprising; an FET, a gate of which is connected to the word line and a drain of which is connected to the bit line; a capacitor, one end of which is connected to a source of the FET and the other end of which is connected to a first power supply; a resistor element provided between the word line and the source of the FET; and a negative differential resistance element provided between the source of the FET and a second power supply.

The seventh aspect of the present invention is a memory device having a memory element provided at an intersection of a word line and a bit line, the memory element comprising; an FET, a gate of which is connected to the word line and a drain of which is connected to the bit line; a capacitor, one end of which is connected to a source of the FET and the other end of which is connected to a power supply; a resistor element provided between the word line and the source of the FET; and a negative differential resistance element provided between the source of the FET and the power supply.

The eighth aspect of the present invention is a memory device having a memory element provided at an intersection of a word line and a bit line, the memory element comprising; an FET, a gate of which is connected to the word line and a drain of which is connected to the bit line; a capacitor, one end of which is connected to a source of the FET and the other end of which is connected to a first power supply; a negative differential resistance element provided between the word line and the source of the FET; and a resistor element provided between the source of the FET and a second power supply.

The ninth aspect of the present invention is a memory device having a memory element provided at an intersection of a word line and a bit line, the memory element comprising; an FET, a gate of which is connected to the word line and a drain of which is connected to the bit line; a capacitor, one end of which is connected to a source of the FET and the other end of which is connected to a power supply; a negative differential resistance element provided between the word line and the source of the FET; and a resistor element provided between the source of the FET and the power supply.

BRIEF DESCRIPTIONS OF THE DRAWINGS

DETAILED DESCRIPTION OF THE PREFERRED EMBODIMENTS

Embodiments of the present invention are described in detail below, with reference made to relevant accompanying drawings.

(First Embodiment)

Figure 1A:
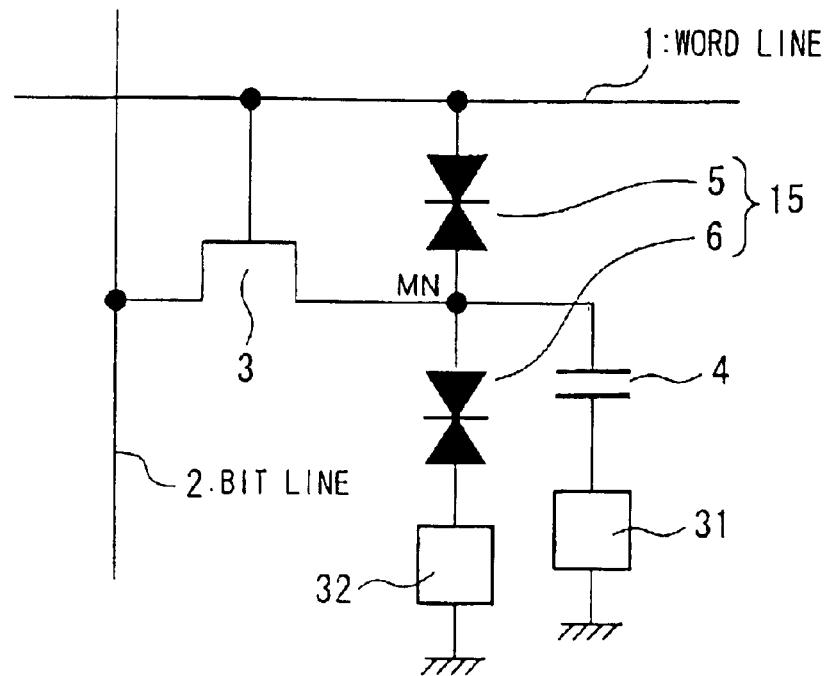
FIGS. 1A and 1B are circuit diagrams of a memory cell in a memory device according to the first embodiment of the present invention.
Figure 1B:
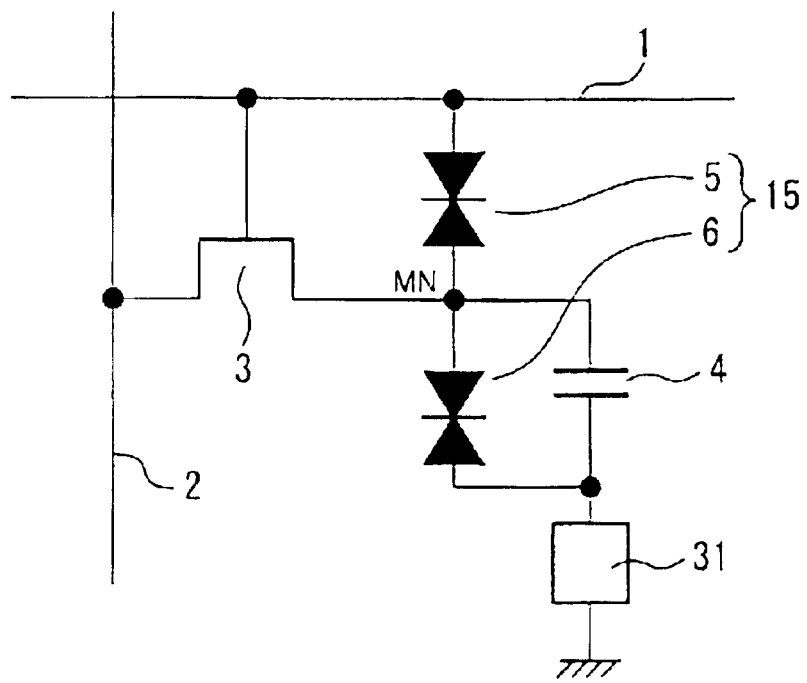
Figure 2:
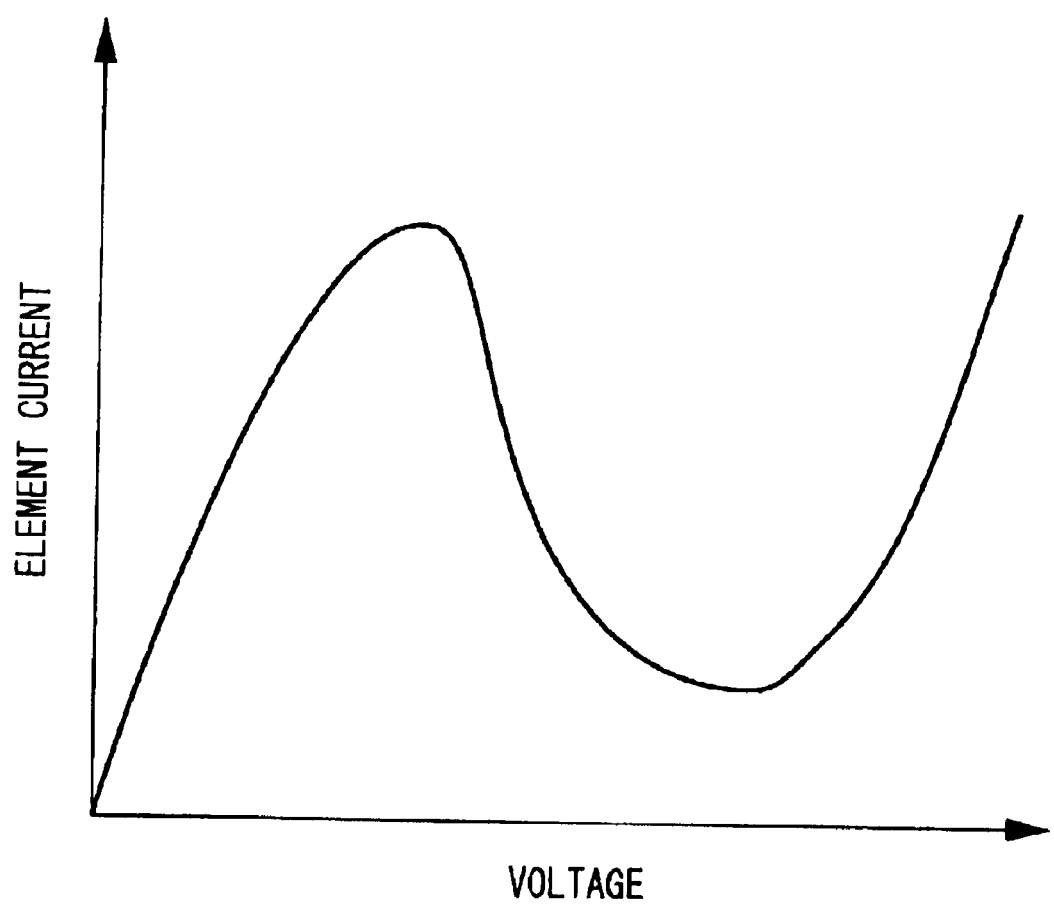
FIG. 2 is a graph showing the static voltage versus current characteristics of a negative differential resistance device used in the circuit of FIG. 1A.
Figure 3A:
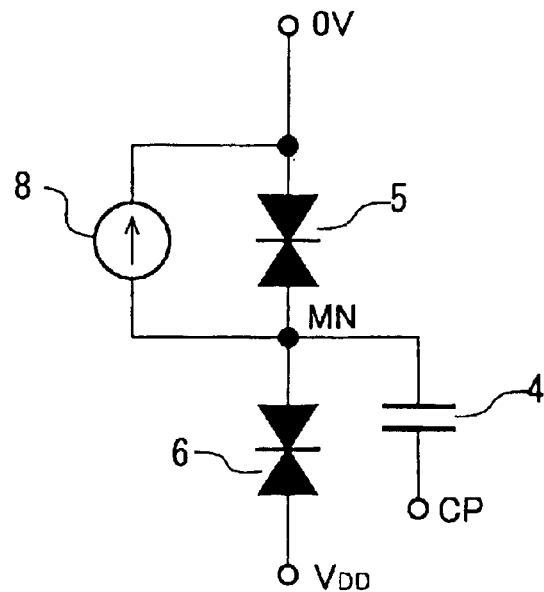
FIG. 3A is an equivalent circuit diagram of the circuit of FIG. 1A in the waiting state.
Figure 3B:
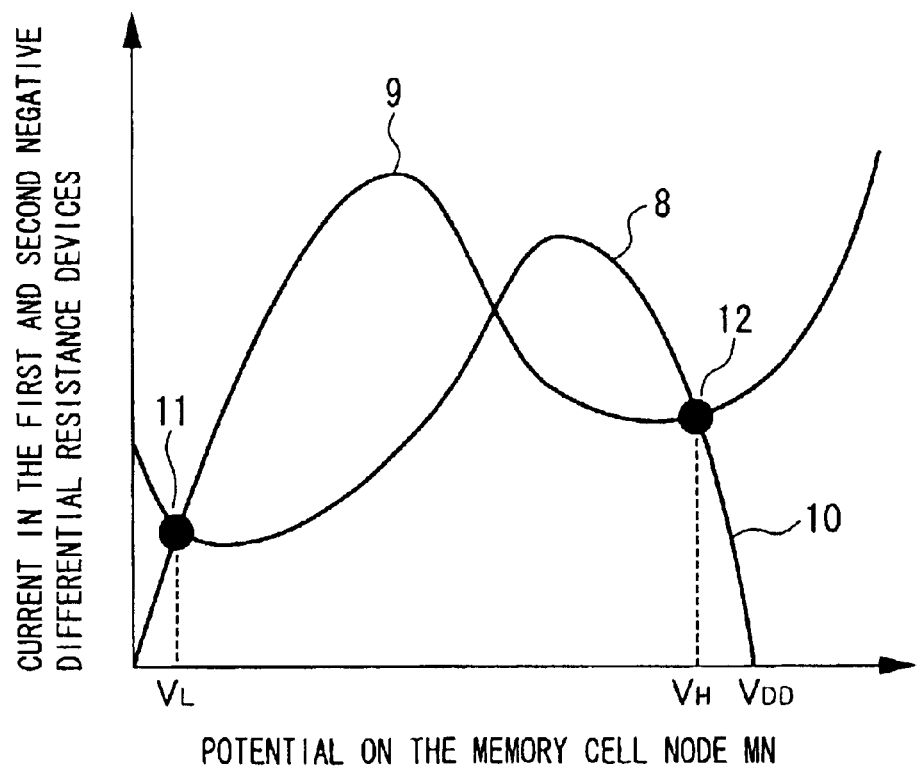
FIG. 3B is a graph illustrating the operation thereof.

FIGS. 1A and 1B are circuit diagrams of a memory cell forming a memory device according to the first embodiment of the present invention. FIG. 2 is a graph showing the static voltage versus current characteristics of the negative differential resistance device used in the circuit of FIGS. 1A, 1B, FIG. 3A is an equivalent circuit diagram of the circuit of FIG. 1A in the waiting state, and FIG. 3B is a graph illustrating the operation thereof.

The memory device of this embodiment has memory cells such as shown in FIG. 1A disposed at the point of intersection of a bit line and a word line. As shown in FIG. 1A, each of these memory cells has an N-channel FET 3, the gate and the drain of which are connected, respectively, to a word line 1 and a bit line 2, a cell capacitance 4 connected between the source of the N-channel FET 3 and a cell plate CP, and a pair of negative differential resistance devices 15, formed by the first and the second negative differential resistance devices 5 and 6, which are connected in series between the word line 1 and a reference voltage line. The node MN between the negative differential resistance devices 5 and 6 is connected to the source of the N-channel FET 3 and one terminal of the cell capacitance 4. The first and second negative differential resistance devices 5 and 6 have N-type (voltage controlled type) negative differential resistance characteristics as shown in FIG. 2, respectively. The tunnel diodes such as the Esaki diode and RTDs are enumerated as such a negative differential resistance device.

The operation of the above-noted memory cell is as follows. As shown in FIG. 3A, when the memory cell is in the waiting state, because the N-channel FET 3 is in the off state, the potential on the word line is held at 0 V. In FIG. 3A, circuit elements corresponding to those in FIG. 1A have been assigned the same reference numerals as in FIG. 1A. The current supply 8 represents either flow of current into the memory cell node MN or leakage current flowing out from the memory cell node MN. In this case, the potential at the connection point 7 to which the second negative differential resistance device 6 is connected is set to VDD. When the potential at the memory cell node MN between the negative differential resistance devices 5 and 6 changes from 0 V to the power supply potential VDD, the currents indicated by the curves 9 and 8 in FIG. 2 flow in the negative differential resistance device 5. The curve 9, which represents a current flowing in the negative differential resistance device 5, includes a leakage current IL added to it. The negative differential resistance device pair 15 formed by the negative differential resistance devices 5 and 6 operates stably at the currents indicated by the two intersection points, 11 and 12, of the curves 9 and 10.

In a conventional DRAM, a leakage current corresponding to the leakage current IL represented by the current source 8 causes a variation in the electrical charge stored in the cell capacitance, making it impossible to statically hold information.

In the memory device according to this embodiment of the present invention, however, even if there is a leakage current, as described above the negative differential resistance device pair 15 operates stably at either of the two stable operating points 11 and 12. Thus, the potential on the memory cell node MN is fixed at one of VL and VH, which are the potentials at the two stable operating points 11 and 12, so that one and the same state is held, as long as the power supply voltage is being supplied. For this reason, the amount of the electrical charge stored in the cell capacitance 4 is either one of two levels of the electrical charge corresponding to the stable potentials VL and VH of the memory cell node MN, this charge level being held in one and the same state, as long as the power supply voltage is being supplied, thereby enabling static holding of information.

As for the current level of the negative differential resistance devices 5 and 6, it is desirable to be as low as possible from the standpoint of power consumption. However, if the leakage current IL exceeds the peak current value of the negative differential resistance device, the stable point 12 no longer exists. Therefore, it is necessary to enlarge the peak current value of the negative differential resistance device at least than the leakage current IL to secure the above-noted bistability. It is possible to satisfy this condition by using a negative differential resistance device having a valley current at the same level as the leakage current value. However, with a ratio of approximately 10 between the peak current value of the negative differential resistance device and the value current, if the variation in leakage current value characteristics between memory cells is considered, it is desirable that the peak current level of the negative differential resistance device be set so as to be approximately 50 to 100 times the average leakage current value (which is approximately 1 to 10 fA). The bistability of the negative differential resistance device pair 15 eliminates the need for the periodic refreshing operation necessary in a conventional DRAM, and reduces the power consumption in the waiting state. For example, if VDD is 3.3 V, the parasitic capacitances of the bit lines and cell capacitances are 270 fF and 27 fF, respectively, the average leakage current level is 1 fA, and the negative differential resistance peak current value and peak/valley current ratio are 100 fA and 10 respectively, compared with a DRAM having the same VDD, same bit line parasitic capacitances, same cell capacitances, and same average leakage current level, in which a refreshing operation is performed each 128 millisecond, there is a reduction in the waiting state power consumption on the order of two orders of magnitude.

The memory cell read/write operations and store operations of the above-noted memory device are exactly the same as in the 1T/1C DRAM of the past. That is, in a read operation, with a bit line pre-charged to a certain potential, the voltage on a selected word line is raised to VDD, so as to turn on the N-channel FET. When this is done, by virtue of the electrical charge stored in the cell capacitance, a potential change occurs at the bit line, this being amplified by a differential amplifier disposed outside the cell. The bit line data amplified by the differential amplifier is read out outside the memory as either a high condition or a low condition, in accordance with the amount of charge that had been stored in the memory capacitance, and is also returned to within the cell via the N-channel FET, so as to perform rewriting of data. In a write operation, similar to the case of a read operation, with data read from each memory cell held on the bit line, the bit line voltage of only the cell to be overwritten is forcibly changed in accordance with the input information, thereby overwriting the cell information.

During a read operation and during a write operation, when the potential on the word line changes to VDD, each potential of one terminal of the negative differential resistance devices 5, 6 becomes VDD, the negative differential resistance device pair 15 raises the potential on the memory cell node MN to VDD. However, because the current level in the negative differential resistance devices is selected so as to be sufficiently smaller than the N-channel FET or sense amplifier drive current, the time constant of raising the potential on the memory cell node MN to VDD is larger than the memory cell access time. For example, with a peak current level of 100 fA for the negative differential resistance device and a bit line parasitic capacitance of 270 fF, the time constant for raising the potential on the memory cell node MN to VDD is greater than 3 seconds. This is sufficiently longer than the 80-nanosecond average access time of the cell, and under these conditions it is possible to neglect the influence of the negative differential resistance device pair 15 on the memory cell access time.

As described above, in a memory device according to this embodiment of the present invention, the current level in the negative differential resistance device is made as small as possible, within a range that does not sacrifice bistability. As a result, in a memory device according to this embodiment, because it is possible to neglect the influence of the negative differential resistance devices on read and write operations, not only does the device have an access time that is equivalent to that of a DRAM, but also it is possible achieve a power consumption in the waiting state that is lower than that of a DRAM.

As noted above, the memory device of the present invention comprises an FET 3, a gate of which is connected to the word line 1 and a drain of which is connected to the bit line 2; a capacitor 4, one end of which is connected to a source of the FET and the other end of which is connected to a first power supply 31; a first negative differential resistance element 5 provided between the word line 1 and the source of the FET; and a second negative differential resistance element 6 provided between the source of the FET and a second power supply 32.

The cell plate voltage can be set so as to be VDD/2, such as in a conventional DRAM. However, with a cell capacitance withstand voltage of VDD or greater, it is possible to set the cell plate voltage to VDD as shown in FIG. 1(b). If this is done, because the values of the cell plate potential and the potential of the reference voltage line to which the negative differential resistance device 6 is connected are the same, it is possible to combine the cell plate and the reference voltage line, this having the advantage of eliminating the need for a separate reference voltage line.

(Second Embodiment)

Figure 4:
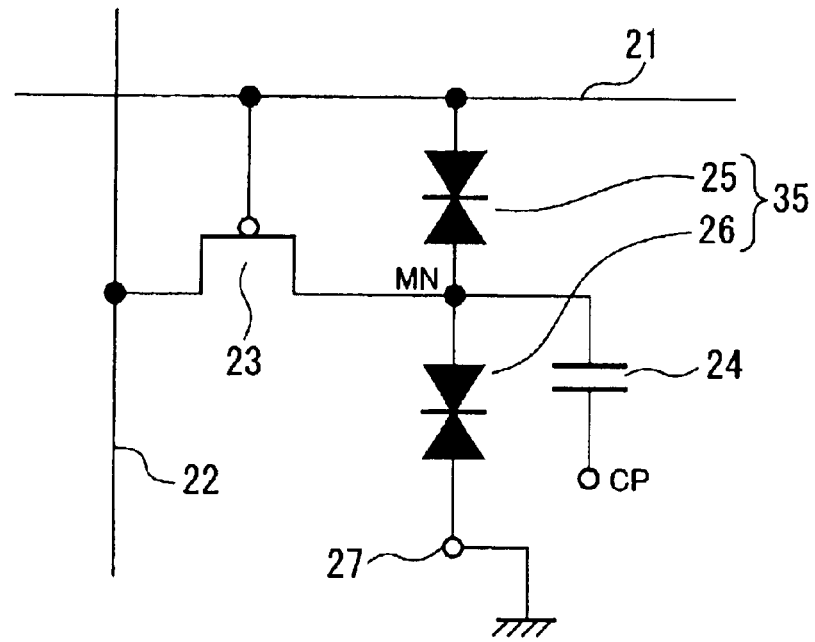
FIG. 4 is a circuit diagram of a memory cell in a memory device according to the second embodiment of the present invention.

FIG. 4 is a circuit diagram of a memory cell forming a memory device according to the second embodiment of the present invention.

The memory device of this embodiment has memory cells such as shown in FIG. 4 disposed at the point of intersection of a bit line and a word line. As shown in FIG. 4, each of these memory cells has a P-channel FET 23, the gate and the drain of which are connected, respectively, to a word line 21 and a bit line 22, a cell capacitance 24 connected between the source of the P-channel FET 23 and a cell plate CP, and a negative differential resistance device pair 35, formed by first and second negative differential resistance devices 25 and 26, which are connected in series between the word line 21 and a reference voltage line. The node MN between the negative differential resistance devices 25 and 26 is connected to the source of the P-channel FET 23 and one terminal of the cell capacitance 24. The reference voltage line potential is set to 0 V. That is, the memory device of the second embodiment is configured so that the N-channel FET of the memory device of the first embodiment is replaced by a P-channel FET, and so that the potential on the reference voltage line is set to 0 V. In this case, because the P-channel FET is off in the waiting state, the potential on the word line 21 is held at VDD. As a result, the voltages 0 V and VDD are applied to the terminals of the negative differential resistance device pair 35 formed by the series connection of the first negative differential resistance device 25 and the second negative differential resistance device 26, so that the same type of bistable operation is obtained as shown in FIG. 3(b) with regard to the first embodiment. In this case, however, the operating curve of the first negative differential resistance device and the operating curve of the second negative differential resistance device are interchanged.

In memory device according to the second embodiment, similar to the case of the memory device of the first embodiment, the current level of the negative differential resistance devices is set to be a small as possible without losing bistable operation. As a result, in a memory device of the second embodiment, for the same reason applying to the memory device of the first embodiment, not only does the device have an access time that is equivalent to that of a DRAM, but also it is possible achieve a power consumption in the waiting state that is lower than that of a DRAM. In the case of setting the cell plate voltage to 0 V, it is possible to connect the terminal of the second negative differential resistance device 26 to the cell plate CP, thereby eliminating the need for the reference voltage line.

(Third Embodiment)

Figure 5:
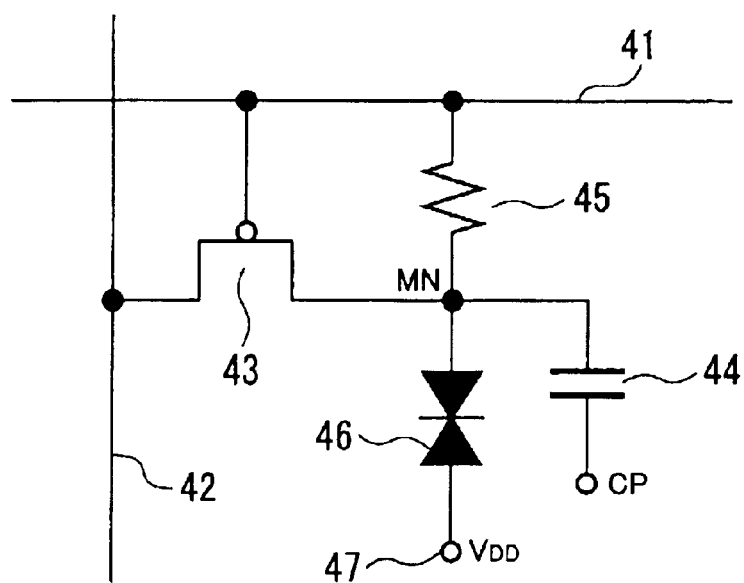
FIG. 5 is a circuit diagram of a memory cell in a memory device according to the third embodiment of the present invention.
Figure 6:
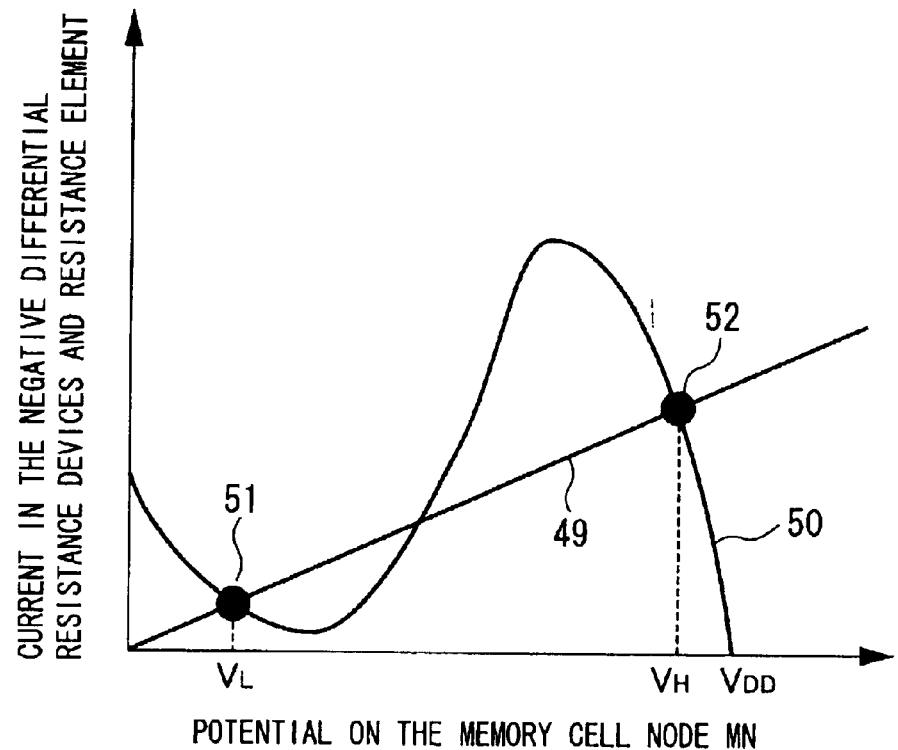
FIG. 6 is a drawing illustrating the operation of the circuit of FIG. 5.

FIG. 5 is a circuit diagram showing a memory cell according to the third embodiment of the present invention, and FIG. 6 is a drawing illustrating the operation of the circuit of FIG. 5 in the waiting state.

A memory device according to the third embodiment of the present invention has memory cells such as shown in FIG. 5 disposed at the point of intersection of a bit line and a word lines. As shown in FIG. 5, each of these memory cells has a N-channel FET 43, the gate and drain of which are connected, respectively, to a word line 41 and a bit line 42, a cell capacitance 44 connected between the source of the P-channel FET 43 and a cell plate CP, and a resistance element 45 and a negative differential resistance device 46, which are connected in series between the word line 41 and a reference voltage line. The node MN between the series-connected resistance element 45 and the negative differential resistance device 46 is connected to the source of the N-channel FET 43 and one terminal of the cell capacitance 44. The reference voltage line potential is set to VDD. That is, the memory cell of the third embodiment is configured so that the first negative differential resistance device of the first embodiment is replaced by a resistance element.

As shown in FIG. 6, by adjusting the resistance value of the resistance element 45, when the potential on the memory cell node MN, which is the connecting point between the resistance element 45 and the negative differential resistance device 46, changes from 0 V to the power supply potential VDD, three-point intersections with the current curve 49 of the resistance element 45 and current curve 50 of the negative differential resistance device 46 are obtained. In this case, the leakage current IL is added to the current curve 49 of the resistance element 45. The two points 51 and 52, at which there is intersection between the current curve 49 of the resistance element and the current curve 50 of the negative differential resistance device 46 are the stable operating points. Thus, the potential on the memory cell node MN is fixed at either one of the voltages VL and VH, which are the operating points 51 and 52, and the same state is held as long as the power supply voltage is supplied. For this reason, the amount of charge stored in the cell capacitance 44 is one of two charge amounts that correspond to the stable potentials VL and VH of the memory cell node, this state being held as long as the power supply voltage is supplied, so that information can be held statically. Even in the case in which the ratio between the peak current value and the valley current value of the negative differential resistance device 46 is not that large, precise control of the resistance value of the resistance element 45 enables stable operation. This embodiment has the advantage of reducing the number of the negative differential resistance device, compared with the circuits shown in the first and the second embodiment of the present invention.

Figure 7:
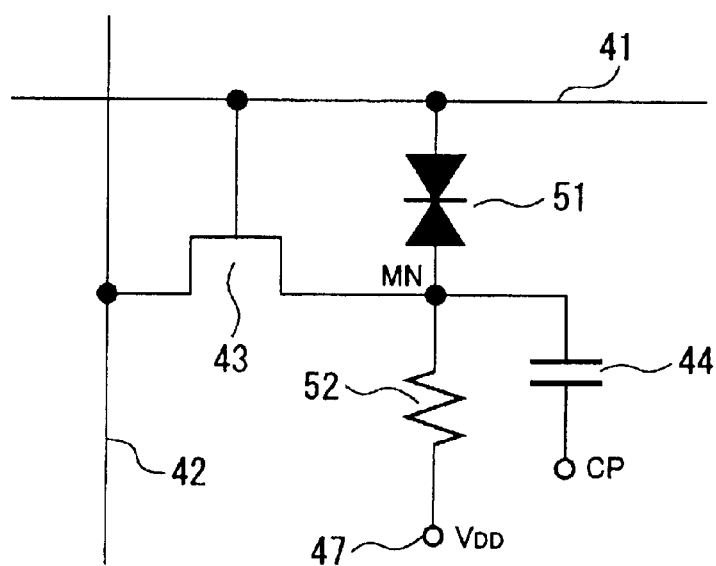
FIG. 7 is another circuit diagram of a memory cell according to the third embodiment of the present invention.
Figure 8:
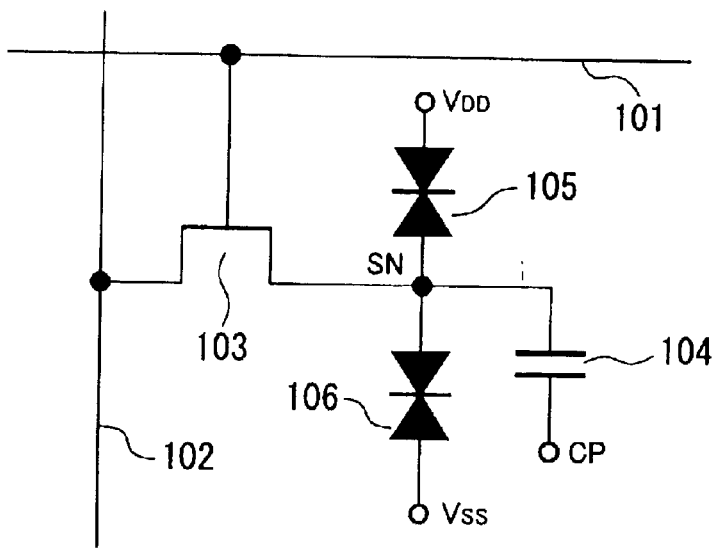
FIG. 8 is a circuit diagram of a conventional memory cell.
Figure 9:
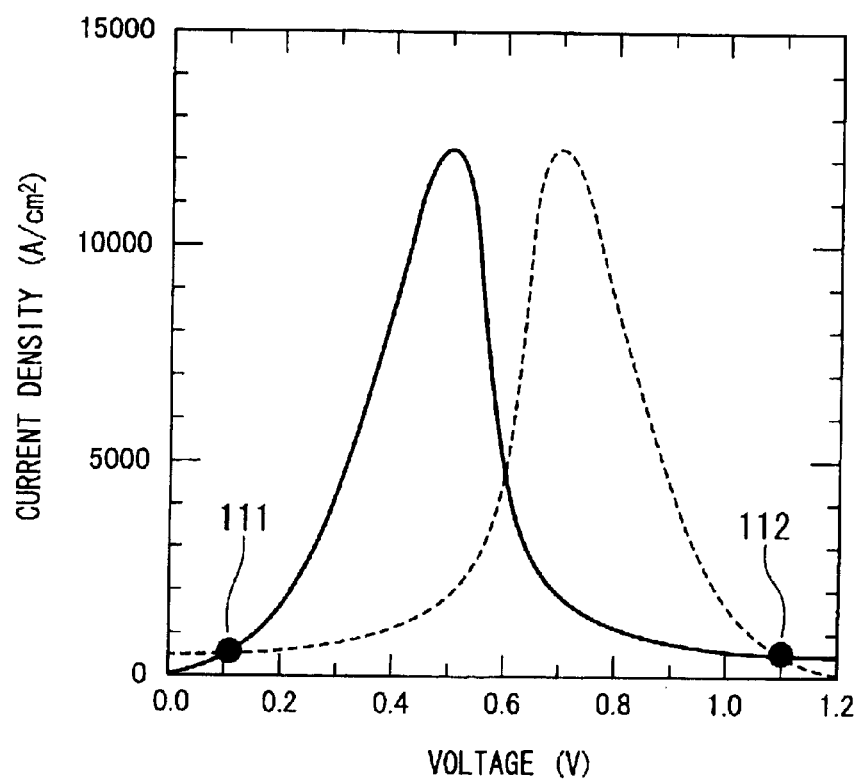
FIG. 9 is a drawing illustrating the operation of the circuit of FIG. 8 in the waiting state.

It is alternatively possible to achieve the above-noted effect by replacing the N-channel FET 43 with a P-channel FET and setting the potential of the reference voltage line to 0 V. Additionally, as shown in FIG. 7, it is alternatively possible to replace the resistance element 45 by a negative differential resistance device 51 and replace the negative differential resistance device 46 by a resistance element 52.

Although preferred embodiments of the present invention are described by examples, it will be understood that these are merely exemplary embodiments, which do not restrict the present invention, which can take other various forms within the scope of the present invention. For example, it is possible to use a negative differential resistance device such as an Esaki diode, a resonant tunnel diode, or other tunnel diode and N-type Gunn diode. Additionally, it is possible to use two terminals of the three terminals of a resonant tunnel transistor or resonant tunnel hot electron transistor. It is further possible that the FTE used in the memory cell be made a bipolar transistor, and further possible, if it is possible to impart a sufficiently high capacitance to the negative differential resistance device, it is possible to omit the cell capacitance 4.

The present invention, as described in detail above, by providing at least one negative differential resistance device each between the memory cell node and the word line or between the memory cell node and the reference voltage line of a memory cell forming a conventional 1T/1C DRAM, achieves bistability of the electrical charge stored in the memory capacitance, thereby enabling static holding of information.

Additionally, by making the cell plate and the reference voltage line have the same potential, the present invention eliminates the need for a separate reference voltage line, thereby enabling connection of the negative differential resistance device entirely within the cell, and enabling a level of integration that is approximately the same as a conventional DRAM, without sacrificing the degree of freedom in cell layout.

What is claimed is:

1. A memory device having a memory element provided at an intersection of a word line and a bit line, said memory element comprising;

an FET, a gate of which is connected to said word line and a drain or which is connected to said bit line;

a capacitor, one end of which is connected to a source of said FET and the other end of which is connected to a first power supply;

a first negative differential resistance element provided between said word line and said source of said FET; and a second negative differential resistance element provided between said source of said FET and a second power supply.

2. The memory device according to claim 1, wherein said FET is an N-channel FET and a potential of said second power supply is a prescribed potential greater than 0V.

3. The memory device according to claim 1, wherein said FET is a P-channel FET and a potential of said second power supply is ground potential.

4. The memory device according to claim 1, wherein said negative differential resistance element is either and Esaki diode or a resonant tunnel diode.

* * * * *